United States Patent [19]

Montalvo et al.

[11] Patent Number: 5,126,808
[45] Date of Patent: Jun. 30, 1992

[54] FLASH EEPROM ARRAY WITH PAGED ERASE ARCHITECTURE

[75] Inventors: Antonio J. Montalvo, San Francisco; Michael A. Van Buskirk, San Jose, both of Calif.

[73] Assignee: Advanced Micro Devices, Inc., Sunnyvale, Calif.

[21] Appl. No.: 426,601

[22] Filed: Oct. 23, 1989

[51] Int. Cl.[5] .......................................... H01L 29/78
[52] U.S. Cl. ...................... 357/23.5; 357/45; 365/185; 365/189.01; 365/238
[58] Field of Search ................ 357/23.5, 45; 365/185, 365/189.01, 238

[56] References Cited

U.S. PATENT DOCUMENTS

| | | | |
|---|---|---|---|
| 4,371,956 | 2/1983 | Maeda et al. | 365/185 |
| 4,458,348 | 7/1984 | Fukuda et al. | 365/185 |
| 4,554,646 | 11/1985 | Yoshimoto et al. | 365/230.03 |
| 4,698,787 | 10/1987 | Mukherjee et al. | 357/23.5 |
| 4,723,229 | 2/1988 | Hartgring et al. | 365/230.03 |
| 4,958,321 | 9/1990 | Chang | 365/185 |

FOREIGN PATENT DOCUMENTS

| | | | |
|---|---|---|---|
| 0297540 | 1/1989 | European Pat. Off. | 365/185 |
| 57-193066 | 11/1982 | Japan | 365/185 |
| 58-96768 | 6/1983 | Japan | 365/185 |
| 60-182162 | 9/1985 | Japan | 365/185 |
| 63-268194 | 11/1988 | Japan | 365/185 |
| 1-5072 | 1/1989 | Japan | 365/185 |

OTHER PUBLICATIONS

R. Shirota, et al., "A 2.3 μm Memory Cell Structure for 16Mb NAND EEPROMS," *IEDM*, pp. 5.4.1-5.4.4, (1990).
R. Kirisaw, "A NAND Structured Cell With a New Programming Technology for Highly Reliable 5V-Only Flash EEPROM," *IEEE 1990 Symposium on VLSI Technology*, pp. 129-130.
T. Tanaka, et al., "A 4-Mbit NAND-EEPROM with Tight Programmed V, Distribution," *IEEE 1990 Symposium on VLSI Circuits*, pp. 105 (1990).
Y. Itoh et al., "An Experimental 4Mb CMIS EEPROM with a NAND Structural Cell," *Digest of Technical Papers, 1989 IEEE Int. Solid-State Circuits Conf.*, pp. 134-135, 314 (1989).
M. Momomodomi et al., "New Device Technologies for 5V-Only 4Mb EEPROM with NAND Structure Cell," *IEDM*, pp. 412-415 (1988).
F. Masuoka et al., "New Ultra High Density EPROM and Flash EEPROM with NAND Structure Cell," *IEDM*, pp. 552-555 (1987).
"A Five-Volt Contactless Array 256K Bit Flash EEPROM Technology", M. Gill et al., *IEEE International Electron Devices Meeting*, Dec. 11-14, 1988, pp. 428-430.
"Drain-Avalanche and Whole-Trapping Induced Gate Leakage in Thin-Oxide MOS Devices", Chi Chang et al., *IEEE Electron Device Letters*, vol. 9, No. 11, Nov. 1988, pp. 588-590.
"Corner-Field Induced Drain Leakage in Thin Oxide MOSFETs", Chi Change et al., *IEEE International Electron Devices Meeting*, Dec. 6-9, 1987, pp. 714-717.
"A Single Transistor EEPROM Cell and Its Implementation in a 512K CMOS EEPROM", S. Mukherjee et al., *IEEE International Electron Devices Meeting*, 1985, pp. 616-619.
"A 128K Flash EEPROM Using Double-Polysilicon Technology", G. Samachisa et al., *IEEE Journal of Solid State Circuits*, vol. SC-22, No. 5, Oct. 1987, pp. 676-683.

(List continued on next page.)

*Primary Examiner*—Rolf Hille
*Assistant Examiner*—Steven Loke
*Attorney, Agent, or Firm*—Skjerven, Morrill, MacPherson, Franklin & Friel

[57] ABSTRACT

A flash EEPROM array architecture including a plurality of pages is provided according to the principles of this invention. Each page of the array is isolated from other pages in the array during reading, programming and erasing of the page. The novel architecture of this invention includes means for erasing through the gate of the flash EEPROM cell.

12 Claims, 9 Drawing Sheets

OTHER PUBLICATIONS

"Degradations Due to Hole Trapping in Flash Memory Cells", Sameer Haddad et al., *IEEE Electron Device Letters,* vol. 10, No. 3, Mar. 1989, pp. 117–119.

"A High Density CMOS 1-T Electrically Erasable Non-Volatile (Flash) Memory Technology", S. Tam et al., *IEEE Electron Devices Society, 1988 Symposium on VLSI Technology Digest of Technical Papers,* San Diego, CA May 10–13, 1988, pp. 31–32.

"A 5V–Only 256K Bit CMOS Flash EEPROM", S. D'Arrigo et al., 1989 *IEEE International Solid–State Circuits Conference,* Feb. 16, 1989, pp. 132–133, 313.

"A 1Mb Flash EEPROM", R.-A. Cernea et al., 1989 *IEEE International Solid–State Circuits Conference,* Feb. 16, 1989, pp. 138–139, 316.

"A 90ns 100K Erase/Program Cycle Megabit Flash Memory", V. Kynett et al., 1989 *IEEE International Solid–State Circuits Conference,* Feb. 16, 1989, pp. 140–141, 317.

"An Investigation of Erase-Mode Dependent Hole Trapping in Flash EEPROM Memory Cell", Sameer Haddad et al., *IEEE Electron Device Letters,* vol. 11, No. 11, Nov. 1990, pp. 514–516.

"Look Out EPROMs, Here Comes Flash", *Electronics,* Nov. 1990, pp. 44–53.

"A 5 Volt Only 16M Bit Flash EEPROM Cell With a Simple Stacked Gate Structure", N. Ajkia et al. of Mitsubishi Electric Corp., *IEDM,* Dec. 1990, pp. 115–117.

"A Novel Sublithographic Tunnel Diode Based 5V–Only Flash Memory", Gill et al., of Texas Instruments, *IEDM,* Dec. 1990, pp. 119–122.

"Process Technology For A 5-Volt Only 4MB Flash EEPROM With An 8.6 UM2 Cell", Gill et al., of Texas Instruments, *IEEE Symposium on VLSI Technology,* Jun. 1990, pp. 125–126.

FLASH EEPROM ARRAY WITH PAGED ERASE ARCHITECTURE

BACKGROUND OF THE INVENTION

1. Field of the Invention

The invention relates generally to an array of flash EEPROM cells and in particular to an architecture for an array of flash EEPROM cells with page erase and negative voltage gate erase.

2. Prior Art

Figure 1:
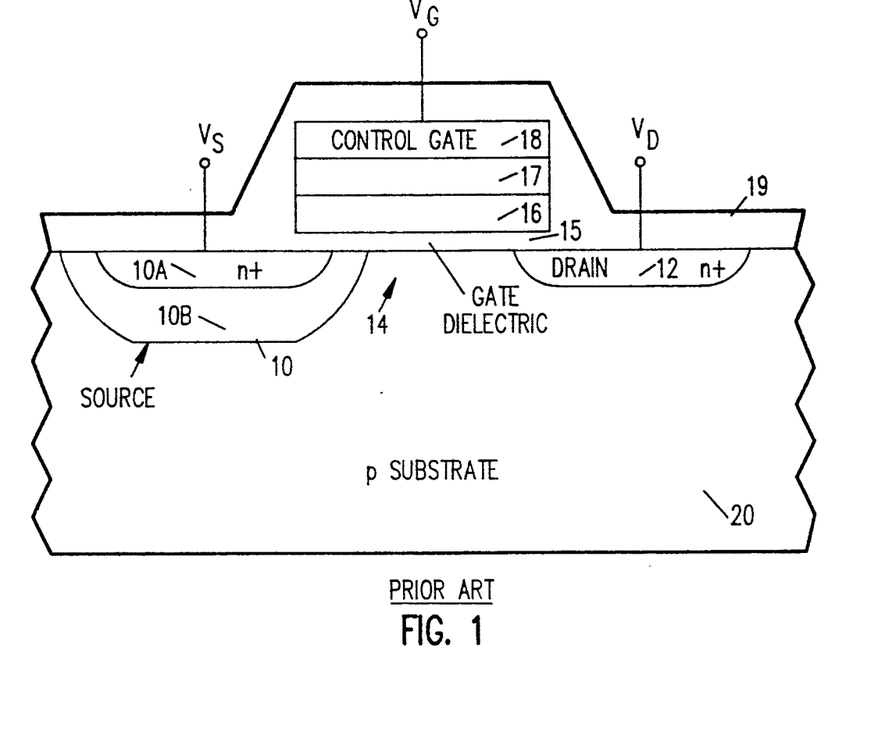
FIG. 1 illustrates a prior art cross-sectional view of an asymmetric flash EEPROM transistor.

Flash electrically erasable programmable read-only memory (EEPROM) has recently emerged as an important nonvolatile memory which combines the advantages of EPROM density with EEPROM electrical erasability. FIG. 1 illustrates a prior art cross-sectional view of an asymmetric flash EEPROM cell. Substrate 20, typically of P conductivity type, has a drain region 12 and a source region 10. Source region 10 consists of a shallow diffusion region 10A and a deeper diffusion region 10B. As used herein, "shallow" and "deep" refer to the distance into the substrate 20 from a selected surface of the substrate. Deep diffusion region 10B is typically formed using a phosphorous implant and shallow region 10A is typically formed using an arsenic implant after the phosphorous implant. Polysilicon gate 16 is separated from substrate 20 surface by a thin dielectric layer 15. Typically, dielectric layer 15 is silicon dioxide having a uniform thickness of about 100 Å. Naturally, other dielectric layers could be used which have dielectric characteristics similar to the 100 Å thick silicon dioxide layer.

Floating gate 16 has a first edge surface substantially aligned with shallow diffusion region 10A and a second edge surface, opposite to the first edge surface, overlying an edge surface of drain 12. A dielectric layer 17, separates control gate 18 from floating gate 16. A channel region 14 in substrate 20 separates source 10 and drain 12. The entire structure is overlaid by an oxide insulating layer 19 and means are provided for applying a source voltage $V_S$ through oxide layer 19 to source 10, a gate voltage $V_G$ to control gate 18, and a drain voltage $V_D$ through oxide layer 19 to drain 12.

To program the flash EEPROM cell of FIG. 1, drain 12 and control gate 18 are raised to predetermined potentials above the potential of source 10. For example, drain 12 has a voltage $V_D$ of about 5 volts while gate voltage $V_G$ is about 12 volts for approximately two to three milliseconds. These voltages produce "hot electrons" which are accelerated across gate dielectric 15 and onto floating gate 16. The hot electron injection results in an increase of the floating gate threshold by approximately 3 to 5 volts. This programming operation is similar to that of the typical EPROM cell.

To erase the flash EEPROM cell, drain 12 is floated. Control gate 18 is grounded and a voltage of about 12 volts is applied to the source for a few milliseconds. If an unprogrammed flash EEPROM cell in an array of such cells is repeatedly erased under these conditions, floating gate 16 acquires a more positive potential. Consequently, with control gate 18 grounded, eventually the cell is always on which in turn prevents reading of any other cell in the column of the array containing this cell. This condition is referred to as bit overerase.

The logical condition of the flash EEPROM cell is determined in a manner similar to the determination of the logical condition of an EPROM cell. Source 10 is held at ground potential and control gate 18 is held at a potential of about 5 volts. Drain 12 is held at a potential between one to two volts. Under these conditions, an unprogrammed cell conducts at a current level of between 25 to 50 microamps. A programmed cell does not conduct. For a more detailed discussion of an asymmetric flash EEPROM cell see for example, U.S. Pat. No. 4,698,787 issued on Oct. 6, 1987 to Mukherjee et al. which is incorporated herein by reference.

Figure 2A:
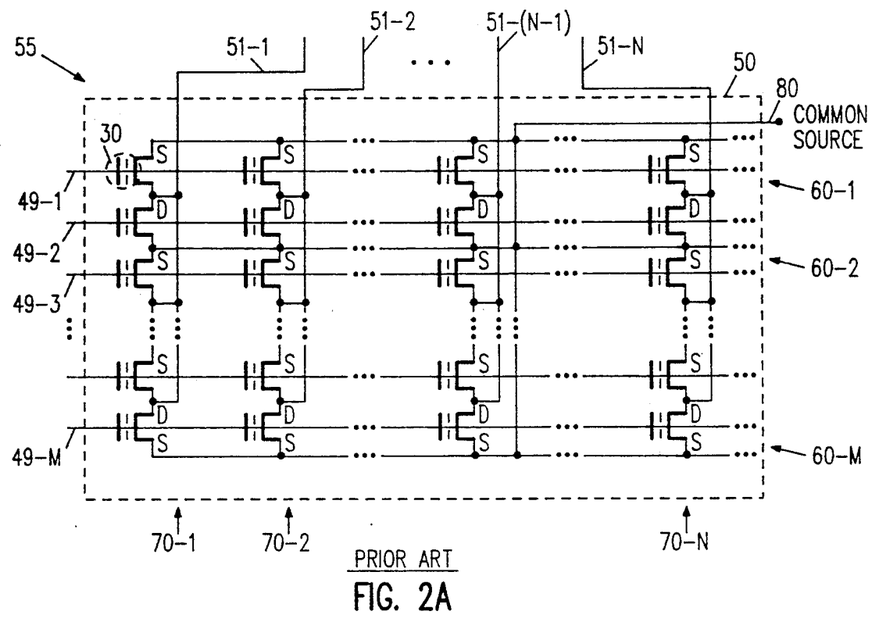
FIGS. 2A and 2B illustrate prior art arrays of flash EEPROM cells.

One embodiment of a prior art array 55 of flash EEPROM cells is illustrated in FIG. 2A. A multiplicity of flash EEPROM cells 30 are arranged in rows 60-1 to 60-M with each cell 30 in a row 60 being part of a column 70. (In the figures, similar components and/or features have the same reference label. The various components are distinguished by following the reference label by a dash and a second label that distinguishes among the similar components. If only the first reference label is used, the description is applicable to any one of the several similar components.) Within a column 70, the drains D of each cell are connected to a common bit line 51. The control gates in each row 60 are connected to a common word line 49. The sources S of all cells 30 are tied to a common source line 80.

This array configuration permits programming of individual cells 30. However, to erase any one cell, in array 55 requires that all of the cells in the array be erased. Specifically, common source line 80 is raised to a high potential level, the bit lines are floated, and all word lines 49 are held at a ground potential. The common connection of the sources of the memory cells in each row results in all cells being erased.

Figure 2B:
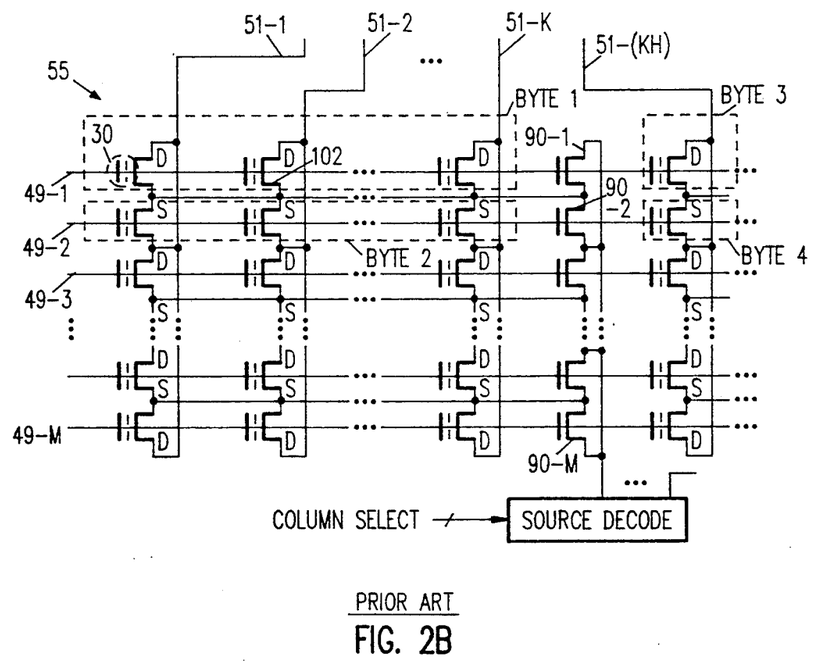

To erase smaller segments of flash EEPROM array 55, the array is subdivided into bytes as illustrated, for example, in FIG. 2B. In this embodiment, a select transistor 90 is added for each byte of array 55. To erase byte 1, word line 49-2 is brought high and all other word lines 49-1, 49-3 to 49-M are held low. All bit lines 51 are floated. Word line 49-2 turns transistor 90-2 on which results in a high voltage, typically 12 volts, on sources S of bytes 1 and 2. Since the gates of byte 2 are high, the cells in byte 2 are not affected, but the cells in byte 1 are erased.

However, this operation results in application of a high voltage to drains D of the cells connected to word line 49-3 and byte 1. Therefore, these cells experience a drain erase which is undesirable, because these cells must be reprogrammed to restore the stored information. Moreover, drain D is not a double diffusion and the high reverse bias voltage may result in breakdown of the junction.

The disruption of the row of cells connected to word line 49-3 is not the only problem associated with the erasure of byte 1. The high voltage on word line 49-2 drives the control gates in byte 4 high. This high voltage increases the charge on the floating gates in the cells in byte 4. Hence, the erasure of byte 1 results in a slow program of byte 4. This effect is referred to as a "gate disturb" of byte 4. In addition, the application of intermediate voltage to the other-decoded sources in byte 1 results in a slow erase of byte 3. Finally, the inherent resistance of transistor 90-1 results in slower programming of byte 1. Moreover, the array in FIG. 2B is large in comparison to the array in FIG. 2A so that arrays using byte selection are expensive.

With the array configuration of FIG. 2B, any row of the array could selectively be erased, if the row was defined as the byte. However, the various problems described above, with this architecture clearly limit the functionality of the array. Therefore, this architecture with a high voltage source erase does not provide a reasonable means for selectively programming and erasing a row of the array.

Figure 3:
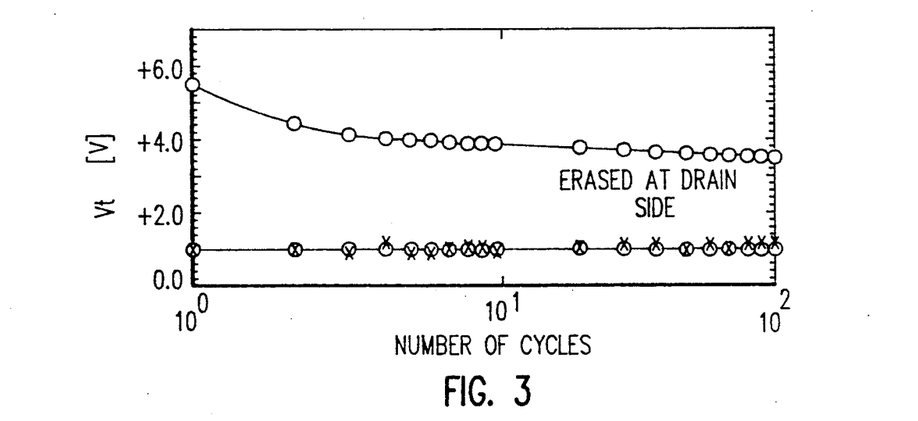
FIG. 3 illustrates programming/erase threshold voltage of a flash memory cell versus number of cycles for drain side erasure.

Alternatively, with the common source connection of FIG. 2A, a column at a time can be erased by applying about 20 volts on bit line 51, grounding word lines 49 and allowing common source line 80 to float or alternatively, grounding line 80. This configuration is referred to as a drain erase. However, as shown in FIG. 3, the number of cycles for a cell erased at a drain is only about 100 so that drain erasure significantly limits the endurance of the cell. Again, since the drain is not formed by a double diffusion, the high voltage on the drain is likely to result in breakdown of the junction.

Accordingly, a flash EEPROM array can selectively erase either a byte, a column, a row or the entire array. Drain erasure of columns limits the endurance of the device and may result in junction breakdown. The erasure of a row results in at least the erasure of another row. The erasure of the entire array limits the flexibility of operation of the flash EEPROM array in comparison to EPROM and EEPROM arrays. Therefore, a means for selectively erasing a predetermined number of rows within a flash EEPROM array while desirable is not currently available.

SUMMARY OF THE INVENTION

The architecture of this invention provides a flash EEPROM array with page erase capability. Accordingly, a selected page of the memory array can be erased and replaced with new data without affecting the other pages of memory in the array. As used herein, a page of memory is a predetermined number of rows within the flash EEPROM array, where each row consists of flash EEPROM cells. Unlike the prior art flash EEPROM array architectures, the architecture of this invention provides a flexible format for flash EEPROM arrays. Moreover, a new means for gate erasure of a flash EEPROM cell is provided. Gate erasure of the array of this invention provides greater endurance as well as enhanced performance in comparison to the prior art arrays. Unlike prior art flash EEPROM arrays, the gate erasure means also permits row replacement within the array of this invention.

The semiconductor device of this invention includes an array having a plurality of pages where each page includes a plurality of rows of flash electrically erasable programmable read-only memory (EEPROM) cells. Addressing means for programming, erasing and reading each of the flash EEPROM cells in the array are coupled to the flash EEPROM cells. The array of this invention also includes means for selecting a page of the array for operation. The selection means isolates any unselected pages from the selected page so that any unselected pages are unaffected by programming, erasing, or reading operations performed on the selected page.

In one embodiment, the flash EEPROM cells have a source, a drain, a floating gate and a control gate. The flash EEPROM cells are arranged in columns in the array. The columns are broken into segments where each page of the array includes a segment of each column. Within a page, a multiplicity of word lines are coupled to the gates of the flash EEPROM cells in each column segment.

In one embodiment, the page select means includes for each page of the array a multiplicity of transistors having a gate, a source/drain and a drain/source. One page select transistor is associated with one column segment within a page. Within a page, all the gates of the page select transistors are connected to a page select line. Each page select transistor is also connected to a page bit line and an array bit line. Each page bit line is also coupled to the drain of each flash EEPROM cell in a column segment of the page. An array bit line is associated with only one column of the array and is coupled to each page select transistor that is associated with a segment of that column.

A signal is applied to only one page select line at a time. In response to the signal on the page select line, each page select transistor couples the array bit line coupled to the transistor to the page bit line which is also coupled to that transistor. Hence, column segments in the page are addressed through word lines and array bit lines. Each page of the array therefore functions individually as a flash EEPROM array and so the array is effectively segmented into smaller arrays, called pages. Each cell in a page can be read and programmed, and either an entire page or an individual row in a page can be erased.

DETAILED DESCRIPTION

The architecture of this invention provides a flash EEPROM array with page erase capability. Accordingly, a selected page of the memory array can be erased and replaced with new data without affecting the other pages of memory in the array. As used herein, a page of memory is a predetermined number of rows within the flash EEPROM array, where each row consists of flash EEPROM cells, as described more completely below. Unlike the prior art flash EEPROM array architectures, the architecture of this invention provides a flexible format for flash EEPROM arrays. Moreover, a new means for erasing the array is provided so that the array of this invention has a greater endurance as well as enhanced performance in comparison to the prior art arrays. The new means for erasing the array permits row replacement within the array.

According to the principles of this invention an array 500 including a multiplicity of flash EEPROM cells (FIG. 4) in a semiconductor device is segmented into a selected number m of pages 400. As described more completely below, m is selected, in one embodiment, based upon silicon size. Unlike prior art flash EEPROM arrays, each page of array 500 is isolated from all other pages. Hence, functions performed on one page do not affect the other pages. A cell in a page 400 can be individually programmed, read, and in one embodiment, an entire page erased without disturbance of other pages. The paged operation of array 500 is made possible through use of a gate erase means, as described more completely below.

Figure 4:
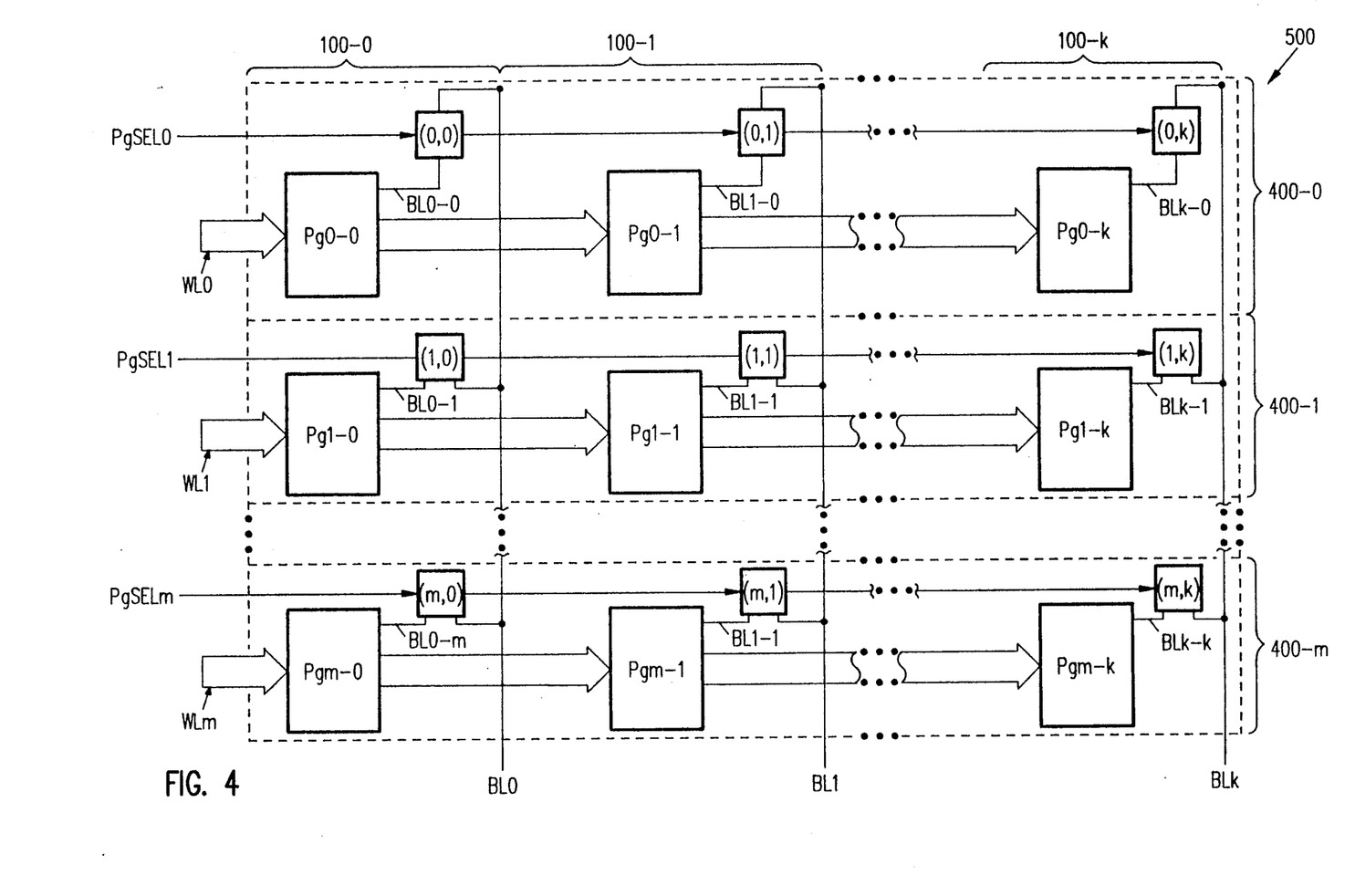
FIG. 4 illustrates the flash EEPROM cell array architecture of this invention.

As illustrated in FIG. 4, array 500 has columns 100-0 to 100-k. The number of columns k+1, and a number of rows n+1 within each of the m+1 pages are typically selected so that array 500 provides a selected memory size, e.g. 512 Kbits. Each column 100 is broken by pages 400 into segments. For example, column 100-0 includes segments Pg0-0 to Pgm-0. Each column segment Pgi-j, where j represents the column and i the page, includes a multiplicity of flash EEPROM cells. Each flash EEPROM cell includes a source, a drain, a floating gate and a control gate. Each segment Pgi-j in a page has a multiplicity of word lines WLi which are coupled to the gates of the flash EEPROM cells in that segment and to the gates of the flash EEPROM cells in the other segments in the page.

Each page 400 also includes a multiplicity of page select means (i, j), where i represents the page and j represents the column. Hence, each column in a page has an associated page select means. Within a page 400-i, all the page select means are connected to a page select line PgSeli. Each page select means (i, j) is also connected to a page bit line BLj-i and a bit line BLj. The page bit line BLj-i is coupled to the drain in each flash EEPROM cell in segment Pgi-j.

The page select means (i, j) isolate the cells in a segment Pgi-j from the other pages. Specifically, a signal is applied to only one page select line PgSeli at a time. In response to the signal on page select line PgSeli, each page select means couples bit line BLj to page bit line BLj-i. Hence, segments Pgi-j in the page are addressed through word lines WLi and array bit lines BL0 to BLk. Therefore, each page i of array 500 functions individually as a flash EEPROM array and so array 500 is effectively segmented into smaller arrays, called pages. As explained more completely below, each cell in a page can be read and programmed and either an entire page or an individual row in a page erased.

Figure 5:
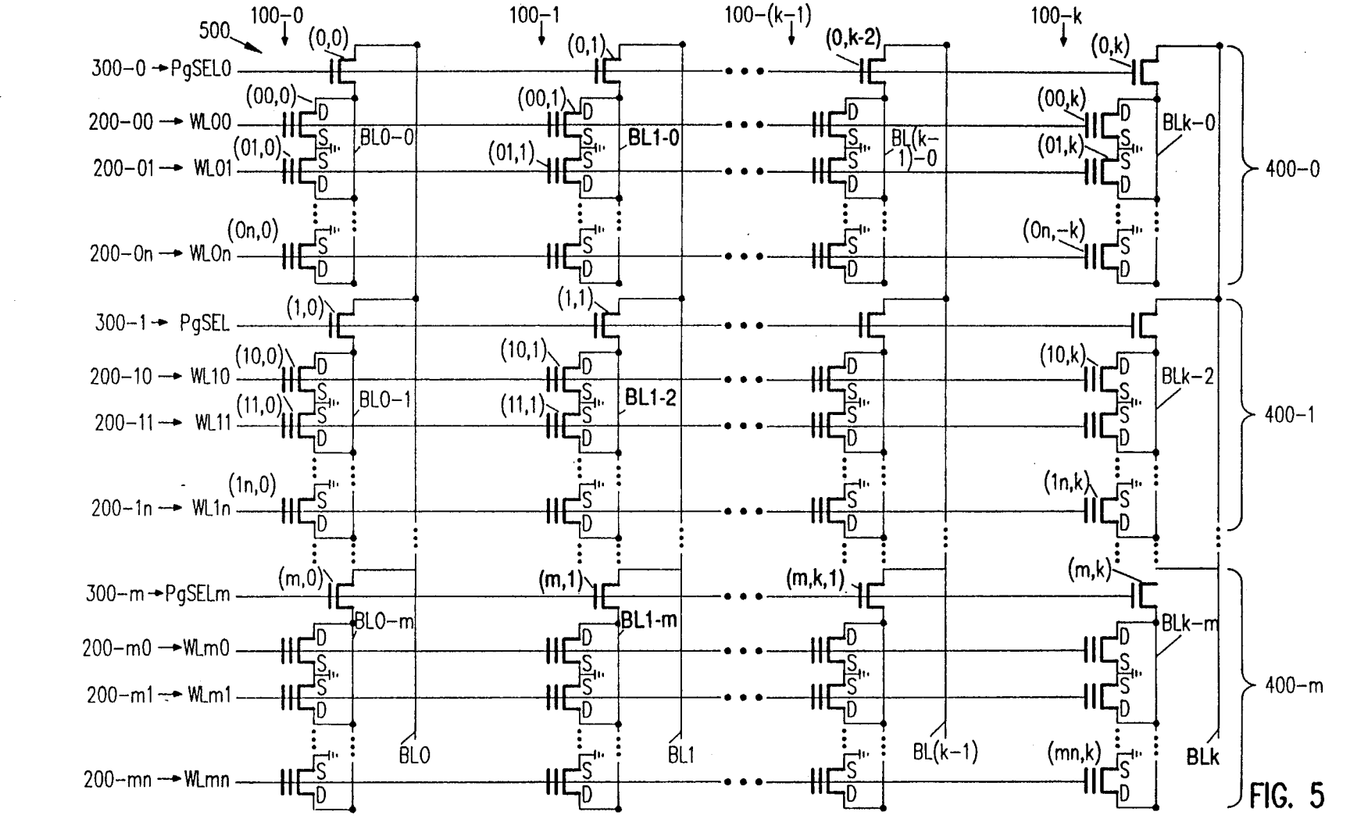
FIG. 5 is a more detailed schematic diagram of the flash EEPROM cell array of this invention.

FIG. 5 illustrates the general architecture of this invention in more detail. A multiplicity of flash EEPROM cells (00,0) ... (mn,k) are arranged in array 500 in (k+1) columns 100-0 to 100-k and (m+1)(n+1) rows 200-00 to 200-mn. Within each row 200, a word line WL connects the control gates, of the flash EEPROM cells in that row. Array 500 also includes a multiplicity of page select transistors (0,0) to (m,k).

Page select transistors (0,0) to (m,k) are arranged in (m+1) rows 300-0 to 300-m with each row 300 containing k+1 of the page select transistors. As described more completely below, each page select transistor has a source/drain, a drain/source and a gate (herein "source/drain" means that the transistor characteristics are such that the transistor has bidirectional characteristics with respect to the drain and source). Within a row 300-i (i=0, ... m) of page select transistors, a common page select line PgSeli (i=0, ... m) connects the gates of the page select transistors in that row.

The drain/source of each page select transistor (i, j), where i is the page and j is the column, is connected to an array bit line BLj which is associated with column j of the array in which page select transistor (i, j) is contained. For example, the drain/source of page select transistor (0,0), which is in column 100-0, is connected to bit line BL0.

The first row of array 500 is row 300-0 of page select transistors (0,0) to (0,k) and another row 300-i of page select transistors is interposed in array 500 after every n+1 rows 200 of flash EEPROM cells. The n+1 rows 200 of flash EEPROM cells between rows 300 of page select transistors are a page 400 of array 500. While in this embodiment the number of rows, n+1 in each page 400 is the same, this is illustrative only of the principles of the invention and is not intended to limit the scope of the invention. In view of this disclosure, those skilled in the art could form pages 400 consisting of unequal number of rows.

Within a column 100-j in a page 400-i, drains D in the flash EEPROM cells in column 100-j are all connected to a page bit line BLj-i where j is the column and i is the page. Page bit line BLj-i is connected to the source/drain of page select transistor (i, j). All sources S of the flash EEPROM cells in array 500 are tied together. In FIG. 5, this tie is represented as a ground symbol. If sources S are not tied together, the size of array 500 increases by about a factor of two.

Figure 6:
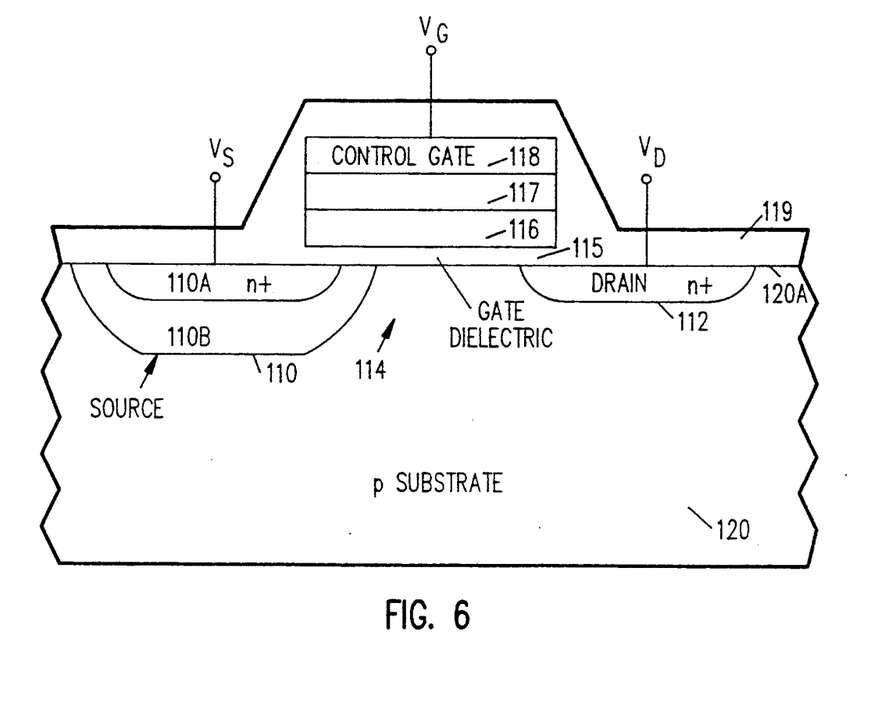
FIG. 6 is a cross-sectional view of an asymmetric flash EEPROM cell suitable for use in the array of this invention.

The operation of a flash EEPROM cell within array 500 is dependent upon the transistor utilized. In one embodiment, an asymmetric flash EEPROM transistor with a double diffused source, such as that illustrated in FIG. 6, is used. The structure in FIG. 6 is made using 1 micron feature design rules. Channel length 114 is about 0.6 μm long. Source 110A and drain 112 arsenic diffusions are about 0.25 μm deep after a high temperature drivein, above 900° C., of a $7 \times 10^{15}$ ions/cm$^2$ implant. Source phosphorous diffusion 110B is about 0.5 μm deep after a high temperature drivein, above 900° C., of a $1 \times 10^{14}$ to $1 \times 10^{15}$ ions/cm$^2$ implant. Here, "deep" refers to the distance into substrate 120 from surface 120A of substrate 120. Channel 114 implant is about $1 \times 10^{13}$ ions/cm$^2$. Uniform gate 115 oxide is less than 120 Å thick, preferably about 100 Å thick. Dielectric layer 117 separating floating gate 116 and control gate 118 is about 250 Å of silicon dioxide. Of course, any dielectric layer such as an oxide, nitride, oxide layer could be used so long as the thickness of the dielectric layer is equivalent to the 250 Å of silicon dioxide. Polysilicon floating gate 116 and polysilicon control gate 118, each have a phosphorous concentration of about $10^{20}$ ions/cm$^3$. Another asymmetric flash EEPROM transistor suitable for use in the array architecture of this invention is described in copending and commonly assigned U.S. Pat. Application Ser. No.

07/247,887 of Chi Chang entitled "ONE TRANSISTOR FLASH EPROM CELL," now U.S. Patent No. 4,958,321, issued September 18, 1990, which is incorporated herein by reference in its entirety.

The parameters for reading, programming and erasing of a flash EEPROM cell with an asymmetric source, for example cell (00,0) in column 100-0, row 200-00 in page 400-0, are presented in Table 1. Cell (00,0) is used as an example of a typical cell in array 500. Therefore, Table 1 describes in general the voltage levels on the lines in array 500 for reading, programming and erasing of an arbitrary flash EEPROM cell.

TABLE 1

| Operations | BL0 | All other Bit Lines | PgSel0 | All other Page Select Lines | WL00 | All other Word Lines in page 400-0 | Word Lines in pages 400-1 to 400-m | Array Source |
|---|---|---|---|---|---|---|---|---|
| Read cell (00,0) | 2 volts | 0 or Float | $V_{CC}$ | 0 | $V_{CC}$ | 0 | 0 | 0 |
| Program cell (00,0) | 6 volts | 0 or Float | 12 volts | 0 | 12 volts | 0 | 0 | 0 |
| Erase page 400-0 | Float | Float | 0 | 0 | −12 volts | −12 volts | 0 | $V_{cc}$ |

Thus, according to the principles of this invention, to program a flash EEPROM cell (00,0), a voltage of about 12 volts is supplied to page select line PgSel0 which in turn applies the high voltage to the gate of page select transistors (0,0) to (0,k) in row 300-0 (FIG. 5). Bit lines BL1 through BLk either have 0 volts applied to them or are allowed to float. However, bit line BL0 has an applied voltage of 6 volts for about 10 microseconds, so that page select transistor (00,0) turns on and applies a positive voltage to drain D of cell (00,0).

A high voltage, e.g., 12 volts, is applied to word line WL00 concurrently with bit line voltage on bit line BL0, i.e., for about 10 microseconds, so that the floating gate in cell (00,0) is programmed by hot electron injection. The voltage on the other page select lines PgSel1 to PgSelm is zero so the other page select rows 300-1 to 300-m effectively isolate the unselected pages from the voltage on bit line BL0. Thus, any page can be cycled indefinitely without disturbing the other pages. To inhibit programming either the word line voltage or the bit line voltage for the cell must be held low.

In programming cell (00,0), a high voltage is applied to the control gate of the other cells in row 200-00. This results in a gate disturb of the other cells in row 200-00 because the charge on the floating gate in each cell increases. Also, the voltage on page bit line BL0-0 is applied to drains D of the cells in column 100-0 within page 400-0. This voltage decreases the charge on the floating gates in cells (01,0) to (0n, 0). As described previously, pages of the array divide each column into segments which are significantly smaller than the length of the column. Therefore, drain disturbs have a negligible effect because the use of column segments reduces the disturb time.

To read cell (00,0), the voltage on bit line BL0 is set to 2 volts and the voltage on all other bit lines is set to 0 volts. The voltage on page select line PgSel0 is set to $V_{CC}$ volts and the voltage on the other page select lines is set to either 0 volts or floated. Voltage $V_{CC}$ is also applied to word line WL00 and all other word lines are held at 0 volts. For this configuration, only the status of cell (00,0) is ascertained. All other cells in column 100-0 of page 400-0 are not activated.

An important aspect of this invention is erasure of a flash EEPROM cell by use of a negative voltage on the control gate of the flash EEPROM cell, referred to as a gate erasure. As explained more completely below, erasure through the control gate permits not only the segmentation of array 500 but also the use of row redundancy in a flash EEPROM array.

To erase page 400-0, bit line BL0 is allowed to float as are all other bit lines BL1 to BLk. All page select lines PgSel0 to PgSelm are set to a 0 voltage level and −12 volts is applied to word lines WL00 to WL0n for page 400-0 for about several hundred milliseconds, typically 200–300 milliseconds. The source voltage is held at +5 volts. In this embodiment, only page 400-0 is erased, because all other word lines have a 0 voltage. Alternatively, the negative voltage is applied to only one word line in the page so as to selectively erase a single row. However, a full page erase should be done such that gate and drain disturbs, described above, do not become significant.

Cells in pages 400-1 to 400-m are disturbed in an erase of page 400-0, because even though the word lines are grounded, a +5 volts is applied to the sources S in array 500. The difference between the gate voltage on selected page 400-0 and the gate voltage for other pages 400-1 to 400-m is 12 volts, in this embodiment. As is known in the art, the erase time for a flash EEPROM cell changes by one order of magnitude per volt difference between the gate and the source. Therefore, if for example, the erase time for selected page 400-0 is one second, the erase time for the unselected pages 400-1 to 400-m would be on the order of $10^{12}$ seconds. Accordingly, the erase disturb, which is generated in this array, is an acceptable condition and does not significantly affect the performance of array 500. Moreover, if a +5 volts is applied to all the word lines in unselected pages 400-1 to 400-m, the erase disturb is completely eliminated.

In addition to array 500, the semiconductor die of this invention includes buffers, sense amplifiers, column and row address circuitry, and address circuitry for the page select lines. These features are known to those skilled in the art and are not considered part of the present invention. (See for example, U.S. Pat. No. 4,698,787 which is incorporated herein by reference.) A future embodiment may include a RAM buffer having at least a one page storage capacity.

The above description was associated with an asymmetric flash EEPROM cell. However, a symmetric flash EEPROM cell can also be incorporated in array 500, because the source junctions in the cell are not reverse biased with a high voltage. Therefore, junction breakdown is not a factor in operation of array 500. A symmetric transistor suitable for use in array 500 is described in copending, commonly assigned and commonly filed U.S. Pat. Application Ser. No. 07/426,332 of S. S. Haddad, et al., entitled "FLASH EEPROM ARRAY WITH NEGATIVE VOLTAGE ERASE OPERATION," now U.S. Patent No. 5,077,691 issued December 31, 1991, which is incorporated herein by reference in its entirety.

The negative gate erase voltage is obtained by use of a charge pump and the external power supply voltage.

Figure 7A:
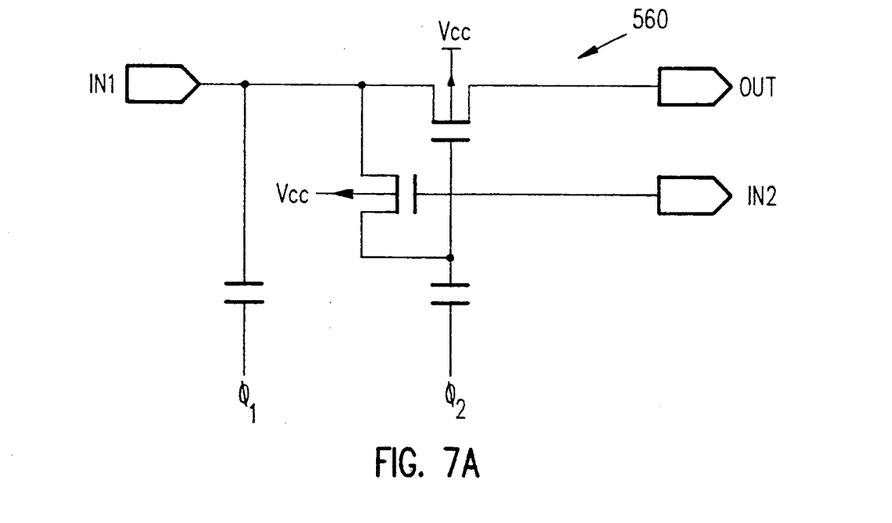
FIG. 7A is a schematic diagram of a single stage of a charge pump circuit for generating the negative gate erase voltage according to the principles of this invention.
Figures 7B, 7C:
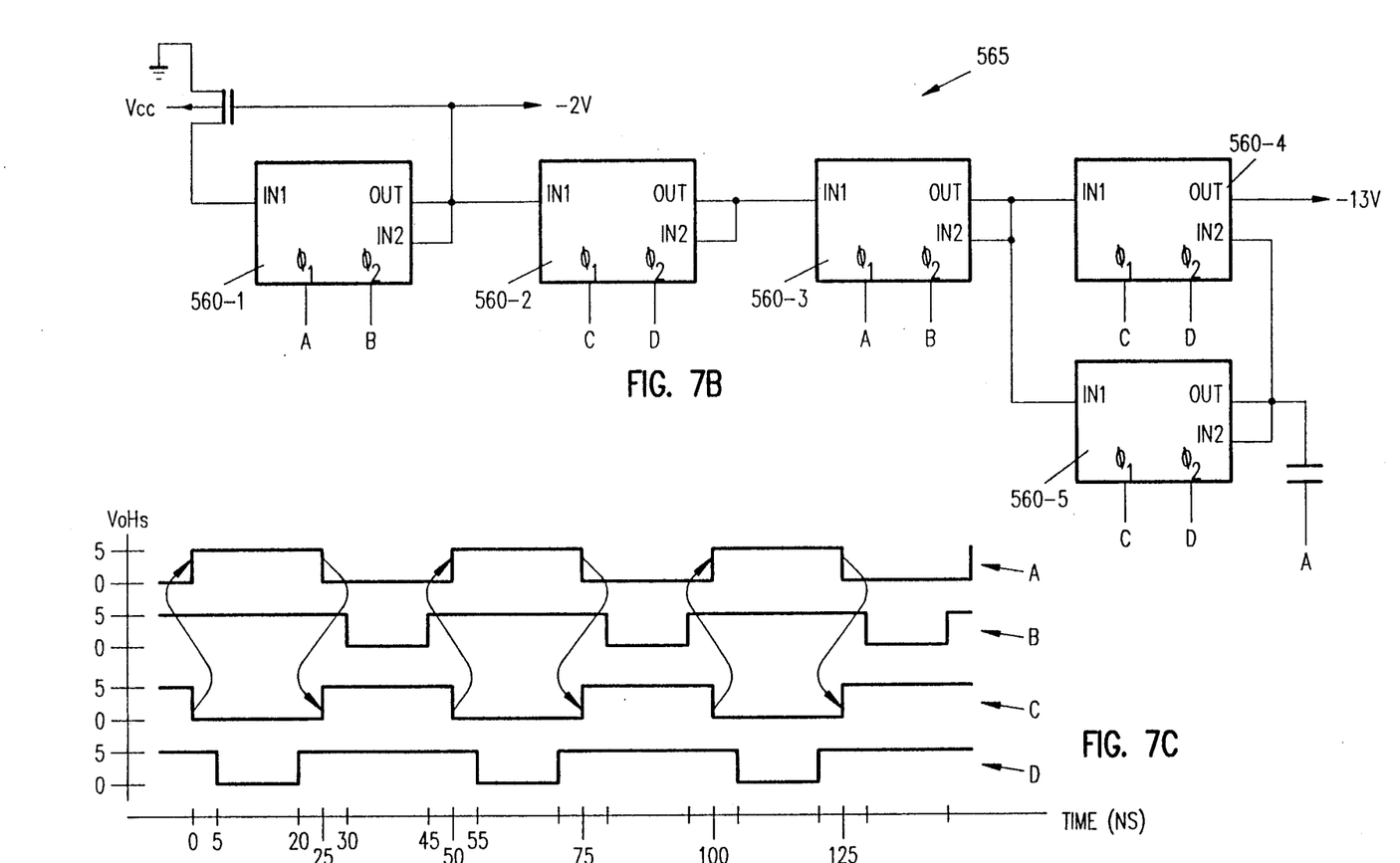
FIG. 7B illustrates the −13 volt charge pump of this invention.
FIG. 7C illustrates the clock signals used with the charge pumps of this invention.

FIG. 7A illustrates one stage 560 of a negative charge pump according to the principles of this invention. Clock signal $\phi_2$ is used to obtain more efficient operation of charge pump 560. FIG. 7B illustrates a −13 volt charge pump 565 consisting of five interconnected single stage charge pumps 560. FIG. 7C illustrates clock signals A, B, C, and D which are applied to the various stages of charge pump 560. The output voltage of the first stage 560-1 of charge pump 565 is about −2 volts and so charge pump 565 provides both a −2 volt output and a −13 volt output. However, in another embodiment, the −2 volts output is supplied by one charge pump and the −13 volts output by another charge pump.

Figure 7D:
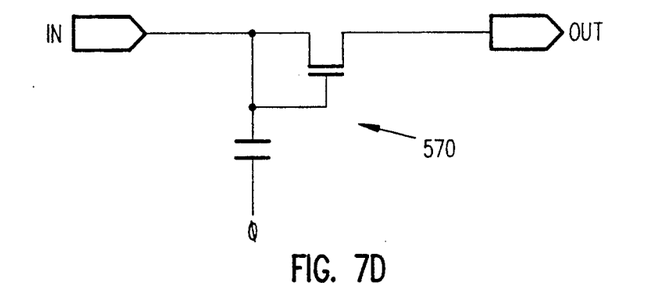
FIG. 7D is a schematic diagram of a single stage for a charge pump having a positive output voltage according to the principles of this invention.
Figure 7E:
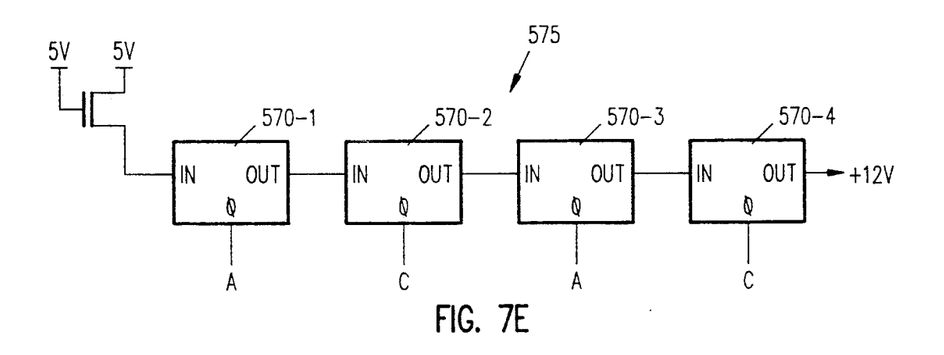
FIG. 7E illustrates the +12 volt charge pump of this invention.
Figure 7F:
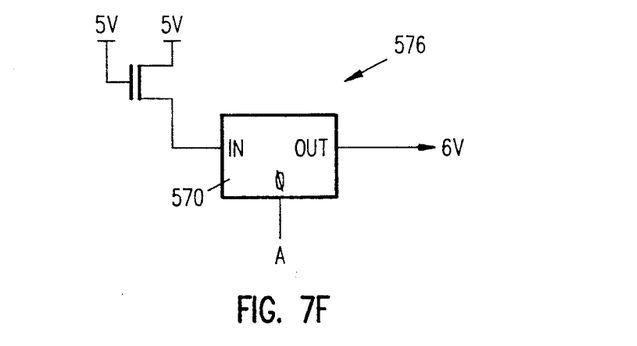
FIG. 7F illustrates the +6 volt charge pump of this invention.

FIG. 7D illustrates a single stage 570 of a positive charge pump according to the principles of this invention with a single clock input signal $\phi$. FIG. 7E illustrates a +12 volt output charge pump 575 which consists of four interconnected single stage charge pumps 570. Clocks signals A, C, which are input signals to charge pump 575, are illustrated in FIG. 7C. FIG. 7F illustrates a +6 volt charge pump 576, which consists of a single stage 570 with clock input signal A of FIG. 7C. The output signals of charge pumps 565, 575 are input signals to row decoder 550 (FIG. 8).

Figure 8:
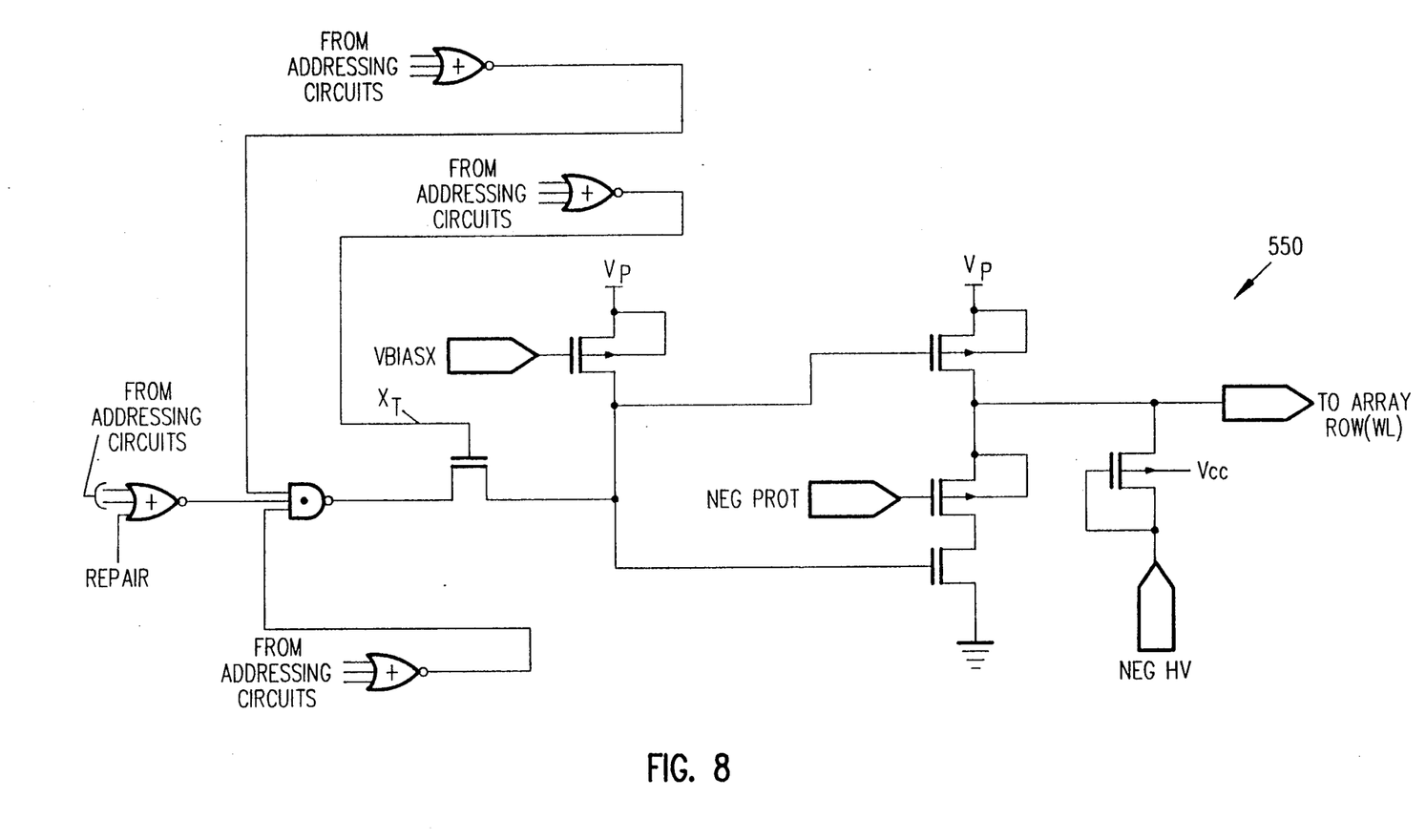
FIG. 8 is a decoder circuit for use with the array of this invention.

Each word line in array 500 is driven by a row decoder 550, illustrated in FIG. 8. Row decoder 550 provides the appropriate voltage to the word line based upon decoded signals and the other voltages applied to the circuit. (See Table 2.). The decoded signals $X_T$, $X_{IN}$ are provided by the word line addressing circuitry described above. Table 2 illustrates for each mode of operation of a flash EEPROM cell the input voltages applied to the row decoder 550 and the output voltage applied to the word line to which row decoder 550 is connected in response to the input voltages. Hence, Table 2 illustrates the operation of row decoder 550.

In Table 2, voltages within several columns in a row are given as "$V_1/V_2$." This means that two cases are represented by that row. The first case uses the voltages in the columns with only a single entry and voltage $V_1$ in the columns with the double entry $V_1/V_2$. The second case uses the voltages in the columns with only a single entry and voltage $V_2$ in the columns with the double entry $V_1/V_2$.

of the bit line capacitance of a bit line in an equivalent prior art array.

Since this architecture significantly lowers the bit line capacitance over prior art arrays, the read cycle of this array is fast in comparison to the prior art arrays. To further enhance the speed performance of the read operation, the channel region of the page select transistor is implanted with P conductivity type ions, typically boron, so that the number of ions/cm$^2$ is approximately an order of magnitude less than the channel implant in the flash EEPROM memory cells. For example, if the channel implant for the flash EEPROM memory cells is $1 \times 10^{13}$ ions/cm$^2$, the implant for the page select transistors would be on the order of $1 \times 10^{12}$ ions/cm$^2$. The page select transistor is a single layer polysilicon N channel FET with about a 200 Å gate oxide layer. The source and drain diffusions for the page select transistors are the same as the arsenic diffusion, described above, for the asymmetric flash EEPROM cell of FIG. 6.

Figure 9:
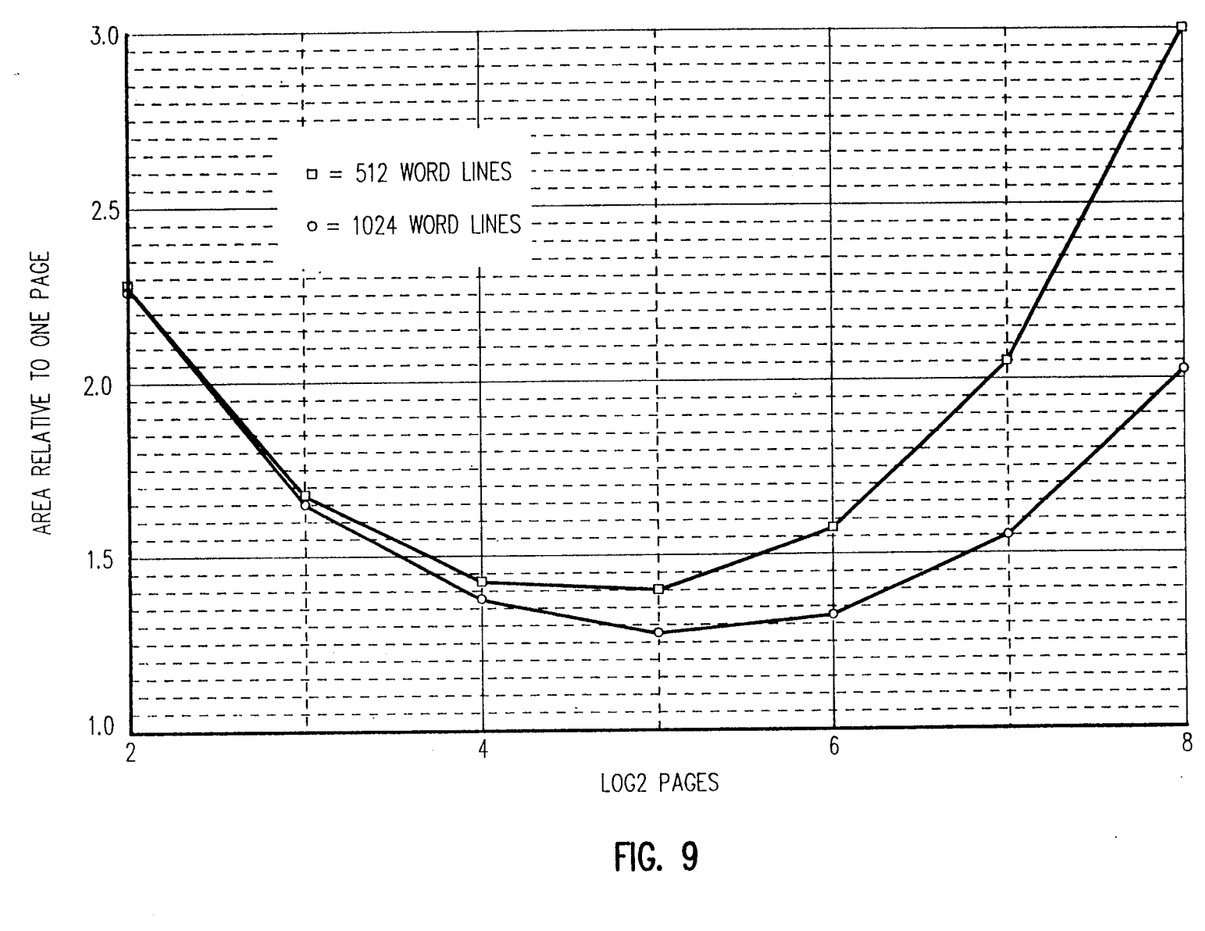
FIG. 9 is a plot of array area versus number of pages according to the principles of this invention.

Two factors enter into the optimum relationship between the number of pages and the array area (array area includes page buffer area). First, to increase yield, each page in the flash EEPROM array has a row of flash EEPROM cells, which are not utilized, between the adjacent page select row and the row of flash EEPROM cells illustrated in FIG. 5. Hence, each page has two unused rows of cells. The silicon area of the unused rows of flash EEPROM cells is included in the area of the page select row. Therefore, the area of a page select row is typically larger than the area of a regular row of flash EEPROM cells. Second, the larger the page, the larger the page buffer (latches are bigger than EEPROM cells). The area of the array, normalized to a 1 page array is given by $$A = ((W + PS*P)C + (WC/P)PB) / WC$$

where, W is the number of word lines, C is the number of columns, PS is size of a page select row 300 relative to a regular row 200, P is number of pages, and PB is size of a page buffer cell relative to the size of a regular flash cell EEPROM. This relationship is plotted below for a 512 word line and a 1024 word line implementation (both 512k) in FIG. 9.

TABLE 2

| MODE | VP | Vbiasx | $X_T$ | $X_{in}$ | Negprot | NegHV | $V_{cc}$ | WL |
|---|---|---|---|---|---|---|---|---|
| READ | 5 | 0 | 0/5 | 5/0 | −2 | 5 | 5 | 0/5 |
| PROGRAM | 12 | 5 | 0/5 | 5/0 | −2 | Float | 5 | 0/12 |
| ERASE | 5 | 0 | 0 | — | 5 | −13 | 5 | −12 |
| PROGRAM INHIBIT | 12 | 5 | 0/5 | 5/0 | −2 | Float | 5 | 0 |

A page 400-i is selected by using a group of addresses to select the page select line PgSeli for that page in a manner known to those skilled in the art. Unselected pages are isolated by the page select transistors, as described above.

This architecture can use long bit lines BL0 to BLk since only the drain capacitance of the selected page is seen by the sense amplifiers. Page bit lines BLj-i are first level metal, according to the principles of this invention. Array bit lines BL0 to BLk are second level metal. Each second level metal bit line is located directly over but insulated from the corresponding first metal page bit lines so that the capacitance of the second metal bit line is not significant. For example, if an array has 32 pages, the bit line capacitance for a page is typically about 1/32

The assumptions used to generate FIG. 9 where
(i) 512k;
(ii) Size of a page select row=4x size of regular flash EEPROM row; and
(iii) size of SRAM buffer cell=5x size regular flash EEPROM cell FIG. 9 shows that the optimum number of pages is 32 for a 1024 word line device. Each page is 32 rows, or 2K Bytes.

Both column and row redundancy can be used in the array of this invention. Row redundancy would probably have to be in page sized blocks. To replace a page with a defective row, the page select line for that page and the word lines for that page are tied to ground.

While one embodiment of this invention has been disclosed, it should be understood that the present disclosure merely exemplifies the principles of the invention and is not intended to limit the invention to the embodiment illustrated. For example, the $-12$ voltage used in the gate erase may be any negative voltage as long as the negative voltage applied to the gate with respect to the source voltage is sufficient to erase the cell. Similarly, the source voltage used during erase may be any positive voltage greater than zero and less than or equal to the power supply voltage $V_{CC}$. Of course, the programming and read voltages may also be similarly varied to achieve the specified function. From the present disclosure, other embodiments and advantages of this invention will be apparent to those skilled in the art.

We claim:

1. A semiconductor device comprising an array means wherein said array means further comprises:
   a plurality of pages, each page including:
      a plurality of rows of flash electrically erasable programmable read-only memory (EEPROM) cells wherein each flash EEPROM cell comprises a transistor having a source, a drain, a floating gate, and a control gate;
      a plurality of page bit line means wherein each page bit line is connected to the drain of a flash EEPROM cell in each of said rows of said page so that (i) said flash EEPROM cells connected to said page bit line means form a column and (ii) said flash EEPROM cells in said column are connected to said page bit line means in parallel;
      means, operatively coupled to said plurality of rows of flash EEPROM cells, for addressing each of said flash EEPROM cells; and
      means, operatively coupled to said addressing means, for selecting a page wherein upon selection of said page, the other pages in said plurality of pages are unaffected by operations on said selected page.

2. The semiconductor device of claim 1 wherein said addressing means includes said plurality of page bit line means and further comprises a plurality of word line means wherein each word line means is connected to the control gates of the flash EEPROM cells in one of said rows.

3. The semiconductor device of claim 2 wherein said page selection means includes a plurality of page select transistors, each transistor having a source, a drain and a gate.

4. The semiconductor device of claim 3 wherein each page bit line means is connected to a source of one of said page select transistors.

5. The semiconductor device of claim 4, said page selection means further comprising a page select line wherein sad page select line is connected to the gates of said plurality of page select transistors.

6. The semiconductor device of claim 5, said addressing means further comprising a plurality of bit lines wherein each bit line is connected to the drain of one page select transistor in each of said pages so that a first predetermined signal on a page select line to the gate of the page select transistor passes a second predetermined signal on the bit line to the drain of the page select transistor to the page bit line.

7. The semiconductor device of claim 1 wherein said array means further comprises:
means, operatively coupled to said rows of flash EEPROM cells, for gate erasure of said flash EEPROM cells.

8. The semiconductor device of claim 1 wherein all of said sources are tied together.

9. A method for reading, programming and erasing a selected portion of a flash electrically erasable programmable read-only memory (EEPROM) cell array comprising:
   segmenting the array into pages, each page consisting of a plurality of rows of said cells;
   connecting a drain of a flash EEPROM cell in each of said rows of a page to a page bit line so that (i) the flash EEPROM cells connected to said page bit line form a column and (ii) the flash EEPROM cells in said column are connected to said page bit line in parallel; and
   providing a page selection means for each page of said array wherein said page selection means isolates any unselected pages from the selected page.

10. The method of claim 9 further comprising the step of erasing only a selected page by gate erasure.

11. The method of claim 9 wherein said providing a page selection means further comprises:
   connecting a source of one page select transistor in a plurality of page select transistors to one page bit line.

12. A semiconductor device comprising:
   array means including a plurality of pages, each page including:
      a plurality of rows of flash electrically erasable programmable read-only memory (EEPROM) cells wherein each flash EEPROM cell comprises a transistor having a source, a drain, a floating gate, and a control gate;
      a plurality of page bit line means wherein each page bit line means is connected to the drain of one flash EEPROM cell in each of said rows of said page so that (i) said flash EEPROM cells connected to said page bit line means form a column and (ii) said flash EEPROM cells in said column are connected to said page bit line means in parallel;
      a plurality of word line means wherein each word line means is connected to the control gates of the flash EEPROM cells in one of said rows;
      a plurality of page select transistors with each page select transistor having a source, a drain and a gate wherein each page bit line means is connected to a source of one of said page select transistors;
      a plurality of bit line means wherein each bit line means is connected to the drain of one page select transistors in each of said plurality of pages so that said bit line means is coupled to a plurality of said page bit line means through said page selection transistors; and
      a page selection line means wherein said page selection line means is connected to each gate of said plurality of page select transistors so that a first predetermined signal on said page select line means passes a second predetermined signal from the drain of the page select transistor to the source of the page select transistor and thereby to the page bit line means wherein in a paged mode of operation of said array a first signal is applied to said page select line means in one page of said array and a second signal is applied to all other page array line means so that said pages receiving said second signal are unaffected by operations on said page receiving said first signal and further wherein said operation on said page receiving said first signal include:

programming a flash EEPROM cell in said page by applying a voltage of about six volts to the bit line means coupled to said cell, either grounding or floating all other bit lien means, and applying a voltage of about twelve volts to the word line means connected to the control gate of said cell; and erasing the flash EEPROM cells in said page by changing said first signal to said second signal and floating said bit line means, applying a voltage of about −12 volts to said plurality of word lines of said page, and applying a predetermined voltage to the sources of the flash EEPROM cells of said page thereby erasing said page of flash EEPROM cells by gate erasure.

* * * * *

UNITED STATES PATENT AND TRADEMARK OFFICE
CERTIFICATE OF CORRECTION

PATENT NO.   :   5,126,808
DATED        :   June 30, 1992
INVENTOR(S)  :   Antonio J. Montalvo et. al.

It is certified that error appears in the above-identified patent and that said Letters Patent is hereby corrected as shown below:

Col. 11, line 57, Claim 5, delete "sad" and insert --said--.

Col. 13, line 10, Claim 12, delete "lien" and insert --line--.

Signed and Sealed this

Second Day of November, 1993

Attest:

BRUCE LEHMAN

*Attesting Officer*     *Commissioner of Patents and Trademarks*